United States Patent
Ueda et al.

[19]

[11] Patent Number: 5,902,405
[45] Date of Patent: May 11, 1999

[54] PLASMA PROCESSING APPARATUS

[75] Inventors: Shigenori Ueda; Junichiro Hashizume, both of Nara; Shinji Tsuchida, Kyoto, all of Japan

[73] Assignee: Canon Kabushiki Kaisha, Tokyo, Japan

[21] Appl. No.: 08/868,315

[22] Filed: Jun. 3, 1997

Related U.S. Application Data

[63] Continuation of application No. 08/420,789, Apr. 12, 1995, abandoned.

[30] Foreign Application Priority Data

Apr. 18, 1994 [JP] Japan .................................. 6-079014

[51] Int. Cl.$^6$ ........................................................ H05H 1/00
[52] U.S. Cl. .................................................... 118/723 E
[58] Field of Search ............................ 118/723 E, 723 R; 156/345; 315/111.21

[56] References Cited

U.S. PATENT DOCUMENTS

| | | | |
|---|---|---|---|
| 3,887,451 | 6/1975 | Cuomo | 204/192 |
| 4,824,546 | 4/1989 | Ohmi | 204/298 |
| 4,872,944 | 10/1989 | Rufin | 156/626 |
| 4,958,591 | 9/1990 | Yamazaki | 118/723 E |
| 4,979,467 | 12/1990 | Kamaji | 118/723 E |
| 4,998,968 | 3/1991 | Misumi | 118/723 E |
| 5,665,166 | 9/1997 | Deguchi et al. | 118/723 E |

FOREIGN PATENT DOCUMENTS

| | | |
|---|---|---|
| 0305269 | 3/1989 | European Pat. Off. . |
| 0432488 | 6/1991 | European Pat. Off. . |

OTHER PUBLICATIONS

H. Curtins, et al. "Influence of Plasma Excitation Frequency for a —Si:H Thin Film Deposition," Plasma Chemistry and Plasma Processing, vol. 7, 1987, pp. 267–273.

Patent Abstracts of Japan, vol. 018 No. 359 (E–1574) Jul. 6, 1994 & JP–A06 097079 Apr. 8, 1994.

Patent Abstracts of Japan, vol. 017 No. 216 (C–1053) Apr. 28, 1993 & JP–A–04 354878 Dec. 9, 1992.

Patent Abstracts of Japan vol. 014 No. 304 (C–0734) Jun. 29, 1990 & JP–A–02 101165 Apr. 12, 1990.

S. Wolf and R.N. Tauber, "Silicon Processing for the VLSI Era", vol. 1, 1986, Lattic Press, pp. 348–352.

*Primary Examiner*—Thi Dang
*Attorney, Agent, or Firm*—Fitzpatrick, Cella, Harper & Scinto

[57] ABSTRACT

A plasma processing apparatus has a second electrode set parallel to a first electrode to be set in a deposition chamber capable of being set in an airtight vacuum, and an RF power supply path for applying an RF power having a discharge frequency of 20 MHz to 450 MHz to the second electrode. In the plasma processing apparatus, a high-voltage capacitor having a small capacitance is arranged on the RF power supply path. With this arrangement, the plasma processing apparatus capable of uniformly, stably processing a relative large base with a plasma at a high processing speed is provided. Further, the plasma processing apparatus in which the manufacturing time can be shortened and cost can be decreased is provided.

27 Claims, 2 Drawing Sheets

PLASMA PROCESSING APPARATUS

This application is a continuation of application Ser. No. 0/420,789 filed Apr. 12, 1995, now abandoned.

BACKGROUND OF THE INVENTION

1. Field of the Invention

The present invention relates to a plasma processing apparatus and, more specifically, a plasma processing apparatus for processing a base using a plasma as an excitation source, which is suitably used for forming a crystalline or nonmonocrystalline functional deposition film, an insulating film, and a metal wiring film available for a semiconductor device and an optical element, i.e., an electrophotographic photosensitive device, an image input line sensor, an image pickup device, a photovoltaic device, and the like, and used for etching, and in which a high frequency of 20 MHz to 450 MHz can be suitably used.

2. Related Background Art

Various types of plasma processing apparatuses are used for semiconductors and the like in accordance with different application purposes. For example, a variety of techniques have been used to enhance their features in, e.g., film formation of an oxide film, a nitride film, and an amorphous silicon-based semiconductor film using a plasma CVD apparatus and method, formation of a metal wiring layer using a sputtering apparatus and method, and micropatterning techniques using an etching apparatus and method.

Strong demand has recently arisen for improving the film quality and processing ability in a plasma processing apparatus, and various implementations therefor have been examined.

Particularly, a plasma process with an RF power is used because it has advantages in stable electric discharge and thus formation of an insulating material such as an oxide film or a nitride film.

The oscillation frequency of a discharge RF power supply used for a conventional plasma process such as a plasma CVD process is generally 13.56 MHz.

FIG. 1 shows an example of a general plasma CVD apparatus conventionally used in deposition film formation. The plasma CVD apparatus shown in a schematic sectional view for an arrangement of FIG. 1 is a film forming apparatus suitably used when an amorphous silicon film (to be referred to as an [a-Si film] hereinafter) is to be formed on a cylindrical electrophotographic photosensitive base. A method of forming an a-Si film using this apparatus will be described below.

A reaction vessel 201 capable of pressure reduction is cylindrical. Part of the reaction vessel forming member also constitutes a second electrode 206. A first electrode 202 which serves as a target film formation base (electrophotographic photosensitive base) as a counter electrode is arranged in the reaction vessel 201. Auxiliary bases 207 and 208 are attached to the top and bottom of the first electrode 202 main body to constitute part of the first electrode. In order to improve uniformity in film thickness and film characteristics, the longitudinal size of the second electrode 206 in the axial direction of a cylinder is set equal to the total length of the first electrode 202 and the auxiliary bases 207 and 208 in the axial direction of the cylinder. The interior of the first electrode 202 is heated by an internal heater 203. An RF power supply 212 is connected to only one portion of the second electrode 206 via a matching circuit 211. An evacuation port 205, a main valve 204, a source gas introduction valve 210, and a source gas introduction port 209 are provided.

The target film formation base 202 serving as the first electrode is set in the reaction vessel (deposition chamber) 201. The main valve 204 is opened, and the interior of the deposition chamber 201 is evacuated via the exhaust port 105 once. Then, the source gas introduction valve 210 is opened, and an inert gas is introduced to adjust a flow rate so as to obtain a predetermined pressure. The heater 203 is energized to heat the target film formation base to a desired temperature of 100° C. to 400° C.

Thereafter, a film formation source gas such as a silane gas, a disilane gas, a methane gas, or an ethane gas, and further a doping gas such as a diborane gas or a phosphine gas, as needed, are introduced via the source gas introduction valve 210, and an exhaust speed is adjusted to keep the interior of the deposition chamber 201 at several 10 mTorr to several Torr.

An RF power of 13.56 MHz is supplied from the RF power supply 212 to one portion of the second electrode 206 via the matching circuit 211 to generate plasma discharge between the second electrode 206 and the first electrode 202. The source gas is decomposed to deposit an a-Si film on the target film formation base 203 serving as the first electrode. Meanwhile, the first electrode is heated to a desired temperature within a range of about 100° C. to 400° C. by the heater 203.

As needed, the target film formation base is rotated by a rotation mechanism (not shown) to improve the distribution of a film thickness in the circumferential direction.

According to this film forming method, a deposition speed for obtaining an a-Si film to satisfactorily perform as an electrophotographic photosensitive body is set at about 0.5 to 6 $\mu$m/h. If the deposition speed is further increased, sufficient characteristics for an electrophotographic photosensitive body may not be obtained. When an a-Si film is utilized as a general electrophotographic photosensitive body, a film thickness of at least 20 to 30 $\mu$m is required to obtain a good charging ability. The manufacture of the electrophotographic photosensitive body requires a long period of time. For this reason, strong demand has arisen for a technique of shortening the manufacturing time without degrading the characteristics of a photosensitive body.

In recent years, a plasma CVD method using an RF power supply of 20 MHz or more in a parallel-plate plasma CVD apparatus has been reported (Plasma Chemistry and Plasma Processing, Vol. 7, No. 3, (1987) PP. 267–273). This report suggests that the deposition speed can be increased by increasing a discharge frequency to more than conventional 13.56 MHz without degrading the performance of a deposition film, which has received a great deal of attention. A sputtering method and the like using an increased discharge frequency are also reported. Recently, superiority of the increase in discharge frequency over other factors has been widely examined.

In order to increase the deposition speed, a power source having a discharge frequency higher than the conventional discharge frequency of 13.56 MHz is used, and a film is formed in accordance with the same film forming sequence as the conventional one. In this film forming operation, it is confirmed that a film can be formed at a deposition speed higher than the conventional one. In this case, however, another problem which is not significant at a discharge frequency of 13.56 MHz is posed.

More specifically, if a film is formed while rotating a target film formation base, a film having almost the same characteristics as those of a conventional film is certainly deposited. However, sufficient matching of a high frequency power may not be established if a rotation mechanism for a target film formation base is omitted to decrease cost of a film forming furnace and reducing cumbersome maintenance. Further, the length of a wiring for supplying an RF power from a matching circuit to a second electrode is changed to improve the operability of an apparatus. For this reason, electric discharge becomes unstable, or it may not be generated in some cases, varying the film quality in the circumferential direction. That is, when a target film formation base is not rotated, electric discharge becomes unstable and a plasma state in the film forming furnace is greatly localized in the circumferential direction, so that the film quality varies depending on positions.

In addition, the characteristics of a portion having high film quality in the circumferential direction is superior to those of a photosensitive drum on which a film is formed while rotating a target film formation base. In contrast, the characteristics of a portion having poor film quality in the circumferential direction is inferior to those of the photosensitive drum on which a film is formed while rotating the target film formation base. In other words, it is estimated that the photosensitive drum on which a film is formed while rotating the target film formation base is in a state in which a film having good characteristics and a film having poor characteristics are stacked, obtaining average characteristics as a result.

As described above, in film formation using a high frequency of 20 MHz to 450 MHz, if a target film formation base is stationary and a distance between the second electrode and the matching circuit is increased, a phenomenon in which electric discharge becomes unstable or it may not be generated in some cases occurs, resulting in uneven film characteristics. In this manner, undesirable unevenness of an image may occur on a relatively large target object such as an electrophotographic photosensitive body.

Such unevenness of film characteristics poses serious problems when a crystalline or nonmonocrystalline functional deposited film to be used an image input line sensor, an image pickup device, a photovoltaic device, and the like is to be formed, in addition to formation of an electrophotographic photosensitive device. In other plasma processes such as dry etching and sputtering, when having a discharge frequency of 20 MHz to 450 MHz is used, the same unevenness occurs. This unevenness is considered to cause serious problems in practical applications.

In this manner, it is found that, if a connecting wiring distance between the matching circuit 211 for matching a high frequency power source and the cathode electrode 206 is increased, the inductance of the wiring itself is increased, so that sufficient matching may not be established. For this reason, electric discharge becomes unstable, or it may not be generated in some cases. Since the degree of freedom of the wiring between the matching circuit and the cathode electrode is extremely low, an apparatus arrangement having a high degree of freedom of wiring and the like has been desired.

SUMMARY OF THE INVENTION

The present invention has been made to solve the above problems, and has as its object to provide a plasma processing apparatus capable of uniformly, stably processing a relative large base with a plasma at a high processing speed which cannot be achieved in a conventional plasma process.

It is another object of the present invention to provide an optimal plasma processing apparatus for efficiently, stably manufacturing, e.g., an electrophotographic photosensitive body which is excellent in image characteristics.

It is still another object of the present invention to provide a plasma processing apparatus having a second electrode set parallel to a first electrode to be set in a deposition chamber capable of being set in an airtight vacuum, and a high frequency power supply path for applying a discharge frequency of 20 MHz to 450 MHz to the second electrode, wherein a high-voltage capacitor having a small capacitance is arranged on the high frequency power supply path.

DETAILED DESCRIPTION OF THE PREFERRED EMBODIMENTS

Figure 1:
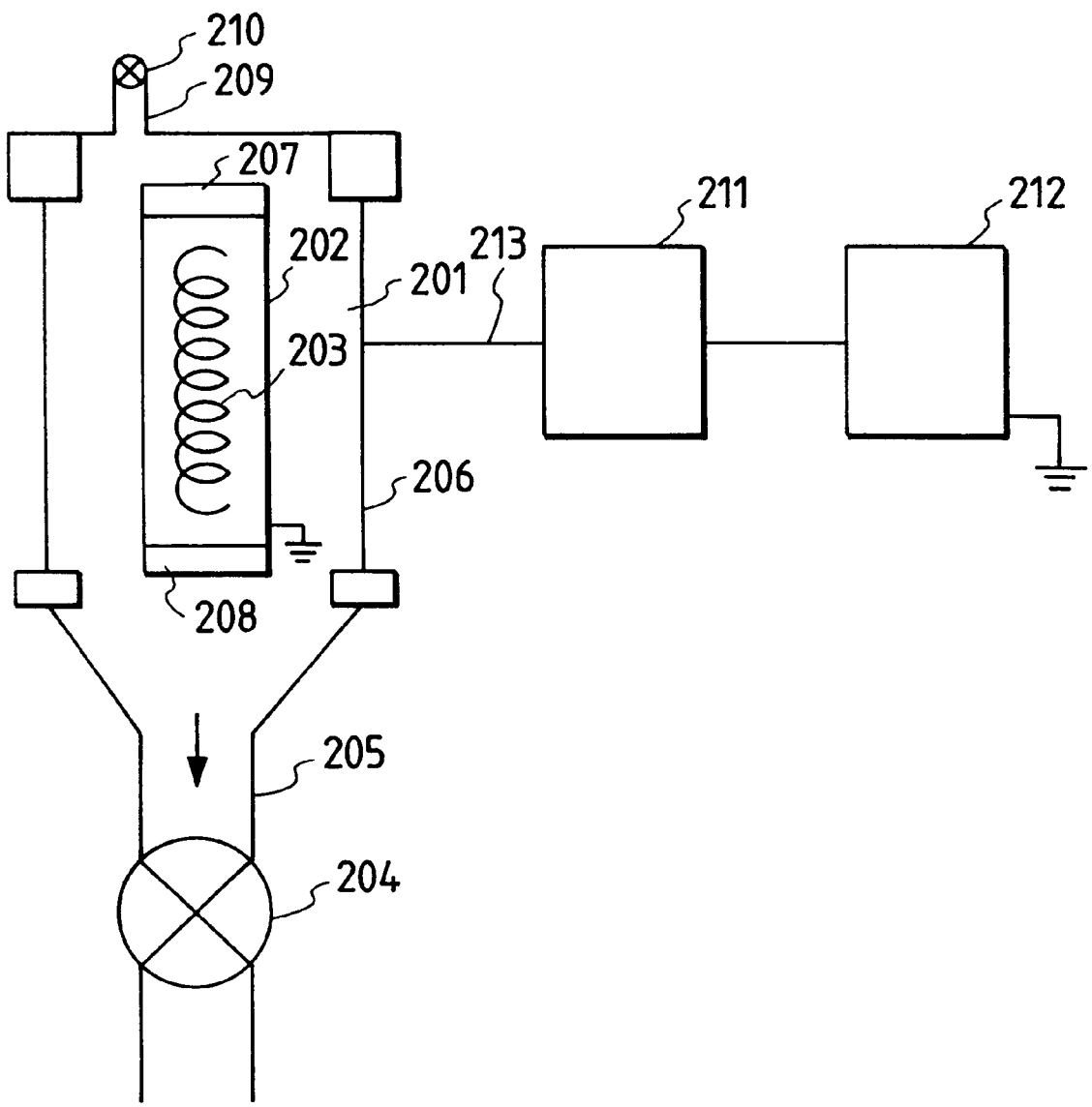
FIG. 1 shows an example of a plasma CVD apparatus for use in conventional film deposition process.

The present inventors made extensive studies to stabilize electric discharge when a film was formed using a discharge frequency of 20 MHz to 450 MHz by changing a distance between a second (cathode) electrode 206 and a matching circuit 211 while a target film formation base is stationary.

As a result, when a high frequency wave within a so-called VHF region of 20 MHz to 450 MHz is to be used, the inductance component of a wiring for connecting the second electrode with the matching circuit cannot be ignored, although this phenomenon is not clarified yet. That is, when a high frequency wave of 20 MHz to 450 MHz is to be used, the following problems are posed. For example, as the wiring distance between the matching circuit and the second electrode is increased, the inductance of the wiring itself is increased, so sufficient matching may not be established. For this reason, the wiring distance must be shortened as much as possible. Since the wiring distance between the matching circuit and the second electrode is limited to a certain distance, the degree of freedom of an apparatus is limited to an extremely narrow range.

The above experiment results in the following findings. In a film forming apparatus using a high frequency wave of 20 MHz to 450 MHz, if a matched power can be stably supplied by minimizing the inductance of the path for supplying a high frequency power, a sufficient power can be supplied without rotating a target film formation base regardless of the wiring distance. Therefore, the quality of a deposition film can be improved, and the degree of freedom of an apparatus arrangement can be increased.

On the basis of the above findings, in order to stably apply a high frequency power of 20 MHz to 450 MHz to the second electrode and supply a sufficient RF power in the entire circumferential direction, a high-voltage capacitor having a small capacitance is arranged on the path for supplying a high frequency power, particularly, near the second electrode. With this arrangement, the inductance of the wiring is cancelled to stably establish matching regardless of the distance between the RF power matching device and the second electrode, thereby efficiently supplying an RF power. Particularly, it is more preferable to set the capacitance of the high-voltage capacitor having a small capacitance at 1 pF to 2,000 pF.

When a high frequency power is supplied from the high frequency power supply to the second electrode via the matching circuit and the high-voltage capacitor having a small capacitance, the high-voltage capacitor having a small capacitance is set at a position closer to the second electrode on the connecting wiring path from the matching circuit to the second electrode. This arrangement is desirable to achieve the more significant effect of the present invention. This is because, if the wiring distance between the high-voltage capacitor having a small capacitance and the second electrode is increased, sufficient matching may not be established in some cases.

The present invention will be described below in detail with reference to the accompanying drawing.

Figure 2:
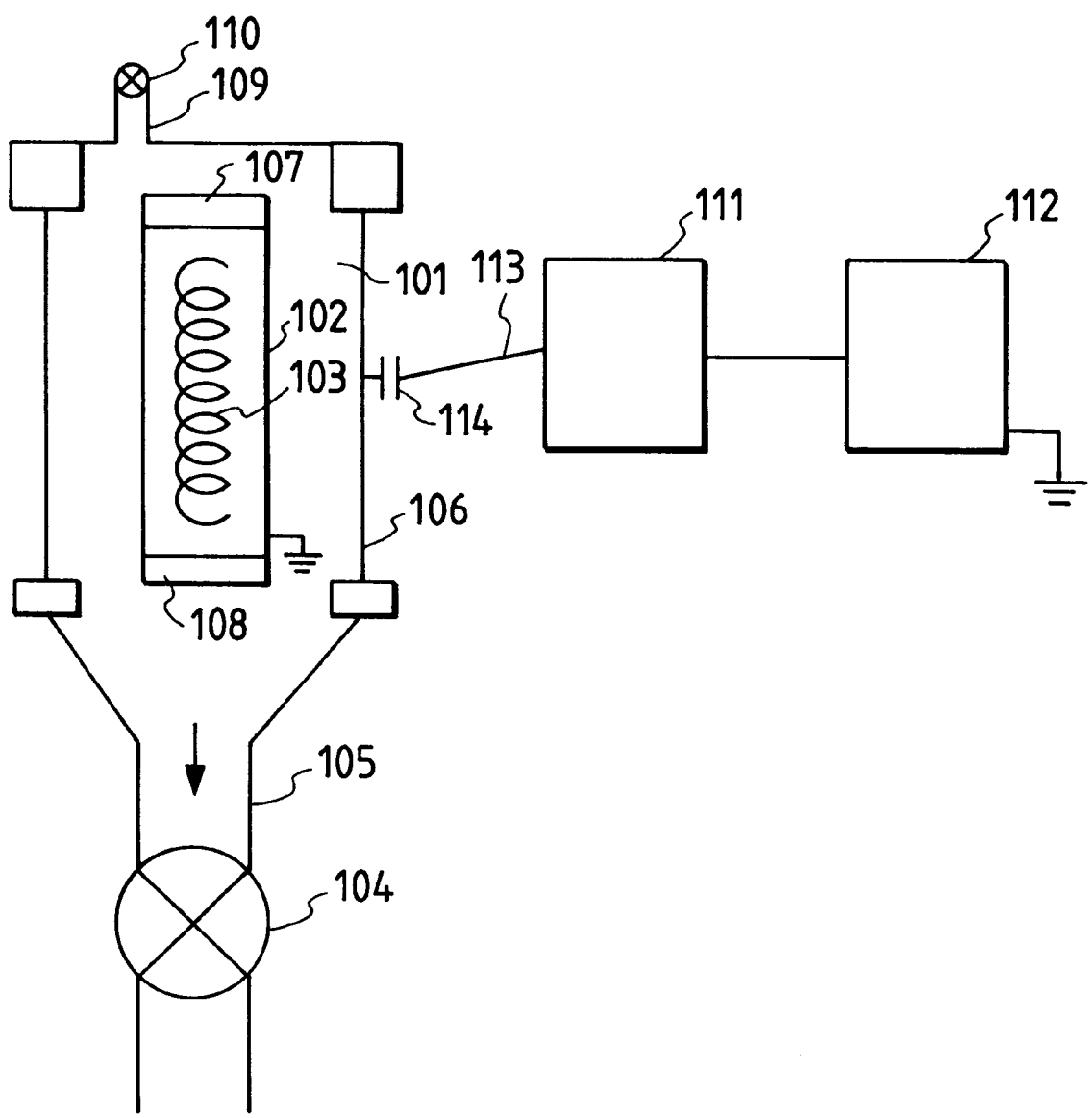
FIG. 2 shows an example of a plasma CVD apparatus for use in the process according to the present invention.

FIG. 2 is a schematic sectional view for explaining a suitable arrangement of an apparatus for performing the method of the present invention. The apparatus is suitable for forming a deposition film of a cylindrical base such as an electrophotographic photosensitive body. Referring to FIG. 2, a deposition film is formed in a deposition chamber 101, and the deposition chamber 101 is connected to an evacuation device (not shown) via a main valve 104. A source gas is introduced from a gas supply system (not shown) into the deposition chamber via a source gas introduction pipe 109. A first electrode 102 is grounded and also serves as a target film formation base. Auxiliary bases 107 and 108 are provided to the top and bottom of the target film formation base. The target film formation base may be made more uniform in the circumferential direction by rotating it by a rotation mechanism (not shown), as needed. A high frequency power supply 112 generates an RF wave of 20 MHz to 450 MHz. A wiring is arranged such that a high frequency output is applied to the second electrode 106 via the matching circuit 111 and the high-voltage capacitor 114 having a small capacitance through the high frequency power supply wiring 113. As shown in FIG. 2, the second electrode 106 may serve as the inner wall of the deposition chamber 101. Alternatively, the second electrode 106 may be separately provided.

In addition, the second electrode 106 is positioned only parallel to the first electrode. In FIG. 2, the second electrode 106 is set concentric with the first electrode 102 to surround it.

The matching circuit is arranged depending on the operability of the apparatus, and a distance between the matching circuit 111 and the second electrode 106 and the length of the wiring are not limited to specific values.

As for the position in a axial direction where an high frequency power is introduced to the second electrode, an RF power is generally introduced into almost the center of the second electrode. Alternatively, even if a high frequency power may be introduced to an arbitrary position in the axial direction as needed, the same effect of the present invention can be obtained.

A material used for the wiring 113 from the matching circuit 111 to the second electrode 106 can comprise any material with a high conductivity. If the inductance of the wiring itself is to be minimized, a preferable material is one having a low permeability. Since a high frequency wave travels only to the outermost surface of a conductor due to a skin effect, the wiring 113 preferably has a surface area as large as possible. Generally, the supply wiring 113 is a plate-like shape. Examples of its material are preferably copper, aluminum, gold, silver, platinum, lead, nickel, cobalt, iron, chromium, molybdenum, titanium, stainless steel, and a composite material of two or more types of these materials.

Any high frequency power supply can be used as long as the oscillation frequency is 20 MHz to 450 MHz. Any output can be suitably used a power of 10 W to 5,000 W or more can be generated, which is suitable for the apparatus. Furthermore, the effect of the present invention can be obtained regardless of fluctuation values of the high frequency power supply.

Any arrangement can be suitably applied to the matching circuit to be used as far as the load of the matching circuit can be matched with that of the high frequency power supply. As a method of establishing matching, a method of automatically adjusting matching is suitable for eliminating a cumbersome operation in manufacturing. If a method of manually adjusting matching is employed, the effect of the present invention is not impaired. As for the position of the matching circuit, no problem is posed as long as the matching circuit is set within a range where matching can be established. It is preferable to arrange the matching circuit at a position where the inductance of the wiring between the matching circuit and the second electrode is minimized. This is because matching can be established in a wide load condition range.

Preferable examples of the material of the second electrode are copper, aluminum, gold, silver, platinum, lead, nickel, cobalt, iron, chromium, molybdenum, titanium, and stainless steel, and a composite material of two or more types of the above materials. The shape of the second electrode is preferably cylindrical, but it may be an elliptical or polygonal shape, as needed. A cooling means may be provided for the second electrode, as needed. Cooling is performed by using a cooling means such as water, air, liquid nitrogen, and a Peltier element, as needed.

The first electrode of the present invention plays a role of a target film formation base, and can have a material and shape in accordance with an application purpose. For example, as for its shape, when the target film formation base is used for an electrophotographic photosensitive body, the shape is preferably cylindrical. The shape of the member may be a planar or another shape, as needed. Examples of the material are copper, aluminum, gold, silver, platinum, lead, nickel, cobalt, iron, chromium, molybdenum, titanium, stainless steel, and a composite material of two or more types of the above materials. In addition, an insulating material such as polyester, polyethylene, polycarbonate, cellulose, acetate, polypropylene, polyvinyl chloride, polyvinylidene chloride, polystyrene, glass, ceramics, and a paper sheet can be used. When the target film formation base is used for an electrophotographic photosensitive body, a preferable target film formation base is one having at least a conductive surface obtained by covering a conductive material on such an insulating material.

An example of the method of forming a deposition film according to the present invention will be performed as in the following sequence.

First, for example, the surface of the target film formation base (serving as the first electrode) 102 is lathed. The auxiliary bases 107 and 108 are attached to the resultant target film formation base 102. The heater 103 in the deposition chamber 101 is inserted into the target film formation base 102 and the auxiliary bases 107 and 108.

Next, the source gas introduction valve 110 is closed, and the main valve 104 is opened to evacuate the interior of the deposition chamber via the exhaust port 105 once. The source gas introduction valve 110 is opened, and an inert gas for heating, e.g., an argon gas is introduced into the deposition chamber via the source gas introduction pipe 109. The flow rate of the heating gas is adjusted to keep the interior of the deposition chamber at a desired pressure. Thereafter, a temperature controller (not shown) is operated to heat the base 102 by the heater 103. When the base 102 is heated to a desired temperature, the source gas introduction valve 110 is closed to stop the flow of the gas into the deposition chamber.

In formation of a deposition film, the source gas introduction valve 110 is opened, and a predetermined source gas such as a silane gas, a disilane gas, a methane gas, or an ethane gas, or a doping gas such as a diborane gas or a phosphine gas is introduced into the deposition chamber 110 via the source gas introduction port 109. The exhaust speed is adjusted to keep the interior of the deposition chamber 101 at several 10 mTorr to several Torr. After the pressure is stabilized, the high frequency power supply 112 is turned on to supply a power having a frequency of 20 MHz to 450 MHz, thereby generating glow discharge. At this time, the matching circuit 111 is adjusted to minimize a reflected wave. A value obtained by subtracting the reflected power of a high frequency wave from the incident power thereof is adjusted to a desired value, and a film having a desired thickness is formed. Then, the glow discharge is stopped. Again, the source gas introduction valve 110 is closed, and the inflow of the gas into the deposition chamber is stopped to decrease the pressure of the interior of the deposition chamber to a high vacuum once. The formation of the deposition film is finished. When deposition films having various functions are to be stacked, the above operation is repeated.

The present invention will be described below in further detail by way of experimental examples and examples.

EXPERIMENTAL EXAMPLE 1

In the deposition film forming apparatus shown in FIG. 2, a high frequency power supply 312 having a frequency of 105 MHz was set, and an electric discharge experiment was performed under electric discharge conditions shown in Table 1. In this experimental example, a copper plate 5 cm wide and 20 cm long was used for the wiring 113. A high-voltage capacitor of 20 pF was arranged immediately before the second electrode 106 (at a position from the second electrode by 5 cm). The results are shown in Table 2.

EXPERIMENTAL EXAMPLE 2

In the deposition film forming apparatus shown in FIG. 2, the high frequency power supply 312 having a frequency of 105 MHz was set, and an electric discharge experiment was performed under the electric discharge conditions shown in Table 1. In this experimental example, a copper plate 5 cm wide and 20 cm long was used for the wiring 113. The high-voltage capacitor of 20 pF was arranged immediately after the matching circuit 111. The results are shown in Table 2.

EXPERIMENTAL EXAMPLE 3

In the deposition film forming apparatus shown in FIG. 2, the high frequency power supply 312 having a frequency of 105 MHz was set, and an electric discharge experiment was performed under the electric discharge conditions shown in Table 1. In this experimental example, a copper plate 5 cm wide and 20 cm long was used for the wiring 113. The high-voltage capacitor of 20 pF was arranged in the matching circuit 111. The results are shown in Table 2.

TABLE 1

| | |
|---|---|
| $SiH_4$ | 400 sccm |
| $H_2$ | 400 sccm |
| Base Temperature | 250° C. |
| Pressure | 0.5 Torr |
| Applied Power | 400 W |

TABLE 2

| | Incident Wave | Reflected Wave | Electric Discharge Situation |
|---|---|---|---|
| Experimental Example 1 | 400 W | 0 W | Stable electric discharge |
| Experimental Example 2 | 400 W | 100 W | Slightly unstable electric discharge |
| Experimental Example 3 | 400 W | 400 W | Electric discharge may not be generated |

From the results shown in Table 2, it is confirmed that the more significant effect can be obtained if the capacitor is set at a position closer to the second electrode.

EXAMPLE 1

In the deposition film forming apparatus shown in FIG. 2, a high frequency power supply having a frequency of 105 MHz was set. An a-Si film was formed on an aluminum cylindrical base to prepare an electrophotographic photosensitive body. In this example, the wiring 113 for supplying a high frequency power was 5 cm wide and 10 cm long. A high-voltage capacitor of 10 pF or 20 pF was arranged immediately before the second electrode 106. In this example, the second electrode 106 was set so that a high frequency power was applied to the center of the second electrode 106 in an axial direction, and the base was stationary.

Film formation was performed under manufacturing conditions shown in Table 3.

COMPARATIVE EXAMPLE 1

In the deposition film forming apparatus shown in FIG. 1, the high frequency power supply having a frequency of 105 MHz was set. An a-Si film was formed on an aluminum cylindrical base to prepare an electrophotographic photosensitive body. In this example, the wiring 213 for supplying a high frequency power was 5 cm wide and 10 cm long. In this comparative example, the second electrode 206 was set so that a high frequency power was applied to the center of the second electrode 206 in an axial direction, and the base was stationary.

Film formation was performed under the manufacturing conditions shown in Table 3 as film formation conditions.

EXAMPLE 2

In the deposition film forming apparatus shown in FIG. 2, the high frequency power supply having a frequency of 105 MHz was set. An a-Si film was formed on an aluminum cylindrical base to prepare an electrophotographic photosensitive body. In this example, the wiring 113 for supplying a high frequency power was 5 cm wide and 50 cm long. The high-voltage capacitor of 10 pF or 20 pF was arranged immediately before the second electrode 106. In this example, the second electrode 106 was set so that a high frequency power was applied to the center of the second electrode 106 in an axial direction, and the base was stationary.

Film formation was performed under the manufacturing conditions shown in Table 3.

COMPARATIVE EXAMPLE 2

In the deposition film forming apparatus shown in FIG. 1, the high frequency power supply having a frequency of 105 MHz was set. An a-Si film was formed on an aluminum cylindrical base to prepare an electrophotographic photosensitive body. In this example, the wiring 213 for supplying a high frequency power was 5 cm wide and 50 cm long. In this comparative example, the second electrode 206 was set so that a high frequency power was applied to the center of the second electrode 206 in an axial direction, and the base was stationary.

Film formation was performed under the manufacturing conditions shown in Table 3.

EXAMPLE 3

In the deposition film forming apparatus shown in FIG. 2, the high frequency power supply having a frequency of 105 MHz was set. An a-Si film was formed on an aluminum cylindrical base to prepare an electrophotographic photosensitive body. In this example, the wiring 113 for supplying a high frequency power was 5 cm wide and 100 cm long. The high-voltage capacitor of 10 pF or 20 pF was arranged immediately before the second electrode 106. In this example, the second electrode 106 was set so that a high frequency power was applied to the center of the second electrode 106 in an axial direction, and the base was stationary.

Film formation was performed under the manufacturing conditions shown in Table 3.

COMPARATIVE EXAMPLE 3

In the deposition film forming apparatus shown in FIG. 2, the high frequency power supply having a frequency of 105 MHz was set. An a-Si film was formed on an aluminum cylindrical base to prepare an electrophotographic photosensitive body. In this example, the wiring 213 for supplying a high frequency power was 5 cm wide and 100 cm long. In this comparative example, the second electrode 206 was set so that a high frequency power was applied to the center of the second electrode 206 in an axial direction, and the base was stationary.

Film formation was performed under manufacturing conditions shown in Table 3 as film formation conditions.

TABLE 3

| Lower Blocking Layer | $SiH_4$ | 300 | sccm |
| | $H_2$ | 500 | sccm |
| | NO | 8 | sccm |
| | $B_2H_6$ | 2,000 | ppm |
| | Power | 400 | W |
| | Internal pressure | 0.2 | Torr |
| | Film thickness | 1 | μm |
| Photoconductive Layer | $SiH_4$ | 500 | sccm |
| | $H_2$ | 500 | sccm |
| | Power | 600 | W |
| | Internal pressure | 0.5 | Torr |
| | Film thickness | 20 | μm |
| Surface Protection Layer | $SiH_4$ | 50 | sccm |
| | $CH_4$ | 500 | sccm |
| | Power | 100 | W |
| | Internal pressure | 0.4 | Torr |
| | Film thickness | 1 | μm |

The electrophotographic photosensitive bodies formed in Examples 1, 2, and 3 and Comparative Examples 1, 2, and 3 were evaluated according to the following methods.

Electrophotographic Characteristics

Electrophotographic characteristics of each photosensitive body such as charging ability and sensitivity were evaluated by a modified machine (NP-5060 available from CANON INC.).

Irregularity of Charging Ability →

A 1,000-μA current was applied to a charging unit to realize corona charging on the surface of the photosensitive body. A potential difference of the photosensitive body during one period was measured when the surface potential of the photosensitive body was measured by a surface potentiometer.

Sensitivity →

The photosensitive body was charged to a constant dark surface potential. Immediately, an image was exposed, and the quantity of light at a light surface potential as a predetermined potential was defined as the sensitivity.

Electric Discharge Situation

An electric discharge situation was checked on the basis of an incident wave and a reflected wave obtained when incident and reflected waves of a high frequency power were adjusted by a matching device.

The evaluation results are represented as follows.

⊚ Extremely good

○ Good

Δ No problem in practical application

× Any problem in practical application

The above results are summarized in Table 4. It is proved that the degree of freedom of an apparatus arrangement is extremely low in the conventional apparatus. On the other hand, it is confirmed that the degree of freedom of an apparatus arrangement is greater in the apparatus of the present invention, stable electric discharge is realized, and the characteristics of the formed photosensitive bodies are superior to those of the photosensitive bodies formed in the conventional apparatus arrangement.

TABLE 4

| | | Irregularity of Charging Ability | Sensitivity | Electric Discharge Situation |
|---|---|---|---|---|
| Example 1 | 10 pF | ⊚ | ⊚ | ⊚ |
| | 20 pF | ⊚ | ⊚ | ⊚ |
| Example 2 | 10 pF | ⊚ | ⊚ | ⊚ |
| | 20 pF | ⊚ | ⊚ | ○ |
| Example 3 | 10 pF | ○ | ○ | ○ |
| | 20 pF | ○ | ○ | ○ |
| Comparative Example 1 | | Δ | ○ | ○ |
| Comparative Example 2 | | × | × | × |
| Comparative Example 3 | | × | × | × |

EXAMPLE 4

In the deposition film forming apparatus shown in FIG. 2, the frequency of the high frequency power supply was set at 20 MHz, 50 MHz, 300 MHz, and 450 MHz, and a-Si films were formed on aluminum cylindrical bases to prepare four electrophotographic photosensitive bodies. In this example, the wiring 113 for supplying a high frequency power was 5 cm wide and 100 cm long. The high-voltage capacitor of 10 pF was arranged immediately before the second electrode 106. In this example, the second electrode 106 was set so that a high frequency power was applied to the center of the second electrode 106 in an axial direction, and the base was stationary.

Film formation was performed under the manufacturing conditions shown in Table 3.

The respective electrophotographic photosensitive bodies were evaluated according to the same method as in Examples 1, 2, and 3.

The above results are summarized in Table 5. All the electrophotographic photosensitive bodies had the same good results as in Examples 1, 2, and 3. Therefore, it is proved that the effect of the present invention can be obtained as far as the frequency of the high frequency power supply falls within 20 MHz to 450 MHz.

The obtained electrophotographic photosensitive body was set in a copying machine NP-5060 available from CANON INC. In this state, when an image was formed, a half-tone image was not uneven, and a uniform image could be obtained. Further, when a character original and a photographic original were copied, sharp images faithful to the originals having a high black density could be obtained.

TABLE 5

|  | 20 MHz | 50 MHz | 300 MHz | 450 MHz |
|---|---|---|---|---|
| Irregularity of Charging Ability | ⊚ | ⊚ | ⊚ | ○ |
| Sensitivity | ⊚ | ⊚ | ○ | ○ |
| Electric Discharge Situation | ⊚ | ⊚ | ○ | ○ |

COMPARATIVE EXAMPLE 4

In the deposition film forming apparatus shown in FIG. 1, the frequency of the high frequency power supply was set at 15 MHz and 500 MHz, and a-Si films were formed on aluminum cylindrical bases to prepare two electrophotographic photosensitive bodies. In this example, the wiring 213 for supplying a high frequency power was 5 cm wide and 100 cm long. A high-voltage capacitor of 10 pF was arranged immediately before the second electrode 206. In this example, the second electrode 206 was set so that a high frequency power was applied to the center of the second electrode 106 in an axial direction, and the base was stationary.

Film formation was performed under the manufacturing conditions shown in Table 3 as film formation conditions.

From the above results, stability of electric discharge reached a level having no problem in a practical application at the frequencies of 15 MHz and 500 MHz. However, as for the characteristics of the formed film, the film forming speed was low at 15 MHz. At 500 MHz, uniformity in electric discharge was low to cause unevenness of characteristics and unevenness of a film thickness. For this reason, it is confirmed that the film characteristics of the present invention can not be improved at a frequency except for 20 MHz to 450 MHz.

EXAMPLE 5

In the deposition film forming apparatus shown in FIG. 2, the high frequency power supply having a frequency of 105 MHz was set, and a-Si films were formed on aluminum cylindrical bases to prepare electrophotographic photosensitive bodies. In this example, the wiring 113 for supplying a high frequency power was 5 cm wide and 100 cm long. High-voltage capacitors of 1 pF, 50 pF, 100 pF, 500 pF, 1,000 pF, or 2,000 pF were arranged immediately before the second electrodes 106. In this example, the second electrode 106 was set so that a high frequency power was applied to the center of the second electrode 106 in an axial direction, and the base was stationary.

Film formation was performed under the manufacturing conditions shown in Table 3.

The respective electrophotographic photosensitive bodies were evaluated according to the same method as in Examples 1, 2, and 3.

The above results are summarized in Table 6. All the electrophotographic photosensitive bodies have the same good results as in Examples 1, 2, and 3. Therefore, it is proved that the significant effects of the present invention can be obtained as long as the capacitance of the high-voltage capacitor falls within 1 pF to 2,000 pF.

The resulting electrophotographic photosensitive body was set in a copying machine NP-5060 available from CANON INC. In this state, when an image was formed, a half-tone image was not uneven, and a uniform image could be obtained. Further, when a character original and a photographic original were copied, sharp images faithful to the originals having a high black density could be obtained.

TABLE 6

|  | 1 pF | 50 pF | 100 pF | 500 pF | 1,000 pF | 2,000 pF |
|---|---|---|---|---|---|---|
| Irregularity of Charging Ability | ⊚ | ⊚ | ⊚ | ⊚ | ⊚ | ○ |
| Sensitivity | ⊚ | ⊚ | ⊚ | ⊚ | ⊚ | ○ |
| Electric Discharge Situation | ⊚ | ○ | ○ | ○ | ○ | ○ |

Next, an examination was performed on an electrophotographic photosensitive body which was formed using a frequency falling outside the range of 1 pF to 2,000 pF.

In the deposition film forming apparatus shown in FIG. 2, the high frequency power supply having a frequency of 105 MHz was set, and a-Si films were formed on aluminum cylindrical bases to prepare electrophotographic photosensitive bodies. In this example, the wiring 113 for supplying a high frequency power was 5 cm wide and 100 cm long. A high-voltage capacitor of 0.5 pF or 2,500 pF was arranged immediately before the second electrode 106. In this example, the second electrode 106 was set so that a high frequency power was applied to the center of the second electrode 106 in an axial direction, and the base was stationary.

Film formation was performed under the manufacturing conditions shown in Table 3.

As a result, even if the high-voltage capacitor of any one of 0.5 pF and 2,500 pF was used, no stable electric discharge was generated, and no a-Si film having high quality could be obtained in comparison with the cases shown in Table 6. From these results, it is proved that the extremely significant effect of the present invention can be obtained in the capacitor of 1 to 2,000 pF.

The inductance of the wiring for supplying a high frequency power can be decreased, and a high frequency power can be efficiently, stably supplied to the second electrode. In addition, since a sufficient power can be uniformly supplied to an electric discharge space, the characteristics of a deposition film can be improved.

Moreover, even if a high frequency power within a so-called VHF band is used, stable electric discharge can be realized, and a film can be formed at a high speed without any variation in quality. Therefore, be provided a plasma processing apparatus is provided.

The present invention is not limited to the above examples, and can be properly changed and combined within the spirit and scope of the invention.

What is claimed is:

1. A plasma processing apparatus comprising:
   a deposition chamber having a space an inner pressure of which can be reduced, the deposition chamber having a cylindrical second electrode provided corresponding to and parallel to a first electrode to be arranged in the space; and
   a power supply path for supplying to said second electrode a power with a discharge frequency of 20 MHz through 450 MHz, said supply path having a matching circuit;
   wherein a high-voltage capacitor with capacitance of 1 pF to 2000 pF is connected in series to said power supply path between said second electrode and said matching circuit on a side close to the second electrode, the capacitor being connected to the second electrode in the vicinity of the center of the height of the second electrode.

2. An apparatus according to claim 1, wherein said plasma processing apparatus is a plasma CVD apparatus.

3. An apparatus according to claim 1, wherein said plasma processing apparatus is a plasma CVD apparatus.

4. A plasma processing apparatus according to claim 1, wherein said second electrode is set concentric with said first electrode.

5. An apparatus according to claim 1, wherein said high voltage capacitor is connected within 5 cm from said second electrode.

6. A plasma processing apparatus comprising:
   a deposition chamber the inside of which can be made to have an atmosphere with a reduced pressure;
   a cylindrical second electrode surrounding a first electrode arranged in the atmosphere with a reduced pressure;
   a power supply path for supplying to said second electrode from a power source a high frequency power with a discharge frequency of 20 MHz to 450 MHz, the power supply path being provided with a matching circuit between the power source and the second electrode; and
   a capacitor with capacitance of 1 pF to 2000 pF connected in series to the power supply path between said matching circuit and the second electrode and on a side close to the second electrode, the capacitor being connected to the second electrode in the vicinity of the center of the height of said second electrode.

7. An apparatus according to claim 6, wherein said plasma processing apparatus is a plasma CVD apparatus.

8. A plasma processing apparatus according to claim 6, wherein said second electrode is set concentric with the first electrode.

9. An apparatus according to claim 6, wherein said capacitor is connected within 5 cm from said second electrode.

10. A plasma processing system comprising:
    a plasma processing apparatus for generating a plasma by applying between opposing electrodes a high frequency power with a frequency of 20 MHz to 450 HHz, one of said electrodes having a cylindrical shape capable of surrounding the other opposing electrode; and
    a capacitor for supplying a power to the plasma processing apparatus, connected in series to a power supply path in the vicinity of the center of the height of the electrode having a cylindrical shape, the capacitor being provided closer than a matching circuit provided in the power supply path, for supplying the high frequency power to the electrode having a cylindrical shape.

11. A plasma processing system according to claim 10, wherein a capacitance of said high-voltage capacitor is 1 pF to 2,000 pF.

12. A plasma processing system according to claim 10, wherein said plasma processing apparatus is a plasma CVD apparatus.

13. A plasma processing system according to claim 10, wherein said electrode having a cylindrical shape and the other electrode are arranged concentric with each other.

14. A plasma processing system according to claim 10, wherein said electrodes are arranged in parallel.

15. A plasma processing system according to claim 10, wherein said capacitor is connected within 5 cm from said electrode having a cylindrical shape.

16. A plasma processing system according to claim 10, wherein the other electrode is a substrate to be plasma-processed.

17. A plasma processing apparatus comprising:
    a deposition chamber having a space an inner pressure of which can be reduced;
    a second electrode provided corresponding to and parallel to a first electrode to be arranged in the space; and
    a power supply path for supplying to the second electrode a power with a discharge frequency of 20 MHz to 450 MHz, the supply path having a matching circuit;
    wherein a high-voltage capacitor with capacitance of 1 pF to 2000 pF is connected in series to the power supply path between the matching circuit and the second electrode and at a position within 5 cm from the second electrode.

18. A plasma processing apparatus according to claim 17, wherein the plasma processing apparatus is a plasma CVD apparatus.

19. A plasma processing apparatus according to claim 17, wherein the power supply path from a power source generating the power to the second electrode is one wherein the power supply path comprises one power source, one matching circuit and one capacitor.

20. A plasma processing apparatus comprising:
    a deposition chamber wherein a reduced pressure atmosphere can be formed;
    a second electrode provided opposite to a first electrode to be arranged in the reduced pressure atmosphere; and
    a power supply path for supplying to the second electrode from a power source a high frequency power with a discharge frequency of 20 MHz to 450 MHz, the power supply path having a matching circuit therein;
    a capacitor with capacitance of 1 pF to 2000 pF connected in series to the power supply path between the second electrode and the matching circuit and within 5 cm from the second electrode.

21. A plasma processing apparatus according to claim 20, wherein the plasma processing apparatus is a plasma CVD apparatus.

22. A plasma processing apparatus according to claim 20, wherein the second electrode can surround the first electrode.

23. A plasma processing apparatus according to claim 20, wherein the power supply path from the power source to the second electrode is one wherein the power supply path comprises one power source, one matching circuit and one capacitor.

24. A plasma processing system comprising:
   a plasma processing apparatus for generating a plasma by applying between opposing electrodes a high frequency power with a frequency of 20 MHz to 450 MHz;
   a capacitor for supplying a power to the plasma processing apparatus, connected in series to a power supply path in the vicinity of one of the electrodes, the capacitor being provided on a side closer to the one of the electrodes than a matching circuit provided between a power source generating the power and the one of electrodes and within 5 cm from the one of the electrodes.

25. A plasma processing system according to claim 24, wherein a capacitance of the capacitor is 1 pF to 2,000 pF.

26. A plasma processing system according to claim 24, wherein the plasma processing apparatus is a plasma CVD apparatus.

27. A plasma processing system according to claim 24, wherein the electrodes are arranged in parallel.

* * * * *

UNITED STATES PATENT AND TRADEMARK OFFICE
CERTIFICATE OF CORRECTION

PATENT NO. : 5,902,405
DATED : May 11, 1999
INVENTOR(S) : SHIGENORI UEDA, ET AL.

It is certified that error appears in the above-indentified patent and that said Letters Patent is hereby corrected as shown below:

COLUMN 3

Line 4, "cost" should read --the cost--.
    Line 5, "and reducing" should read --to reduce--.

COLUMN 5

Line 44, "a" should read --an-- and "an" should read --a--.
    Line 67, "used" should read --used if--.

COLUMN 13

Line 7, "be provided a" should read --an excellent, commercial--.

Signed and Sealed this

Twenty-third Day of November, 1999

Attest:

Q. TODD DICKINSON

*Attesting Officer*    *Acting Commissioner of Patents and Trademarks*